(12) United States Patent
Yamamoto

(10) Patent No.: US 7,312,403 B2
(45) Date of Patent: Dec. 25, 2007

(54) CIRCUIT COMPONENT MOUNTING DEVICE

(75) Inventor: Kouki Yamamoto, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/231,746

(22) Filed: Sep. 22, 2005

(65) Prior Publication Data

US 2006/0065438 A1    Mar. 30, 2006

(30) Foreign Application Priority Data

Sep. 24, 2004  (JP) ............................. 2004-276608

(51) Int. Cl.
*H05K 1/16* (2006.01)
(52) U.S. Cl. ...................... 174/260; 174/261
(58) Field of Classification Search ................ 174/260, 174/261; 361/760
See application file for complete search history.

(56) References Cited

U.S. PATENT DOCUMENTS 6,521,997 B1 *  2/2003  Huang et al. .............. 257/737
6,674,178 B1 *  1/2004  Ikegami ..................... 257/789
7,094,068 B2 *  8/2006  Huang et al. ................ 439/70
2005/0011672 A1 *  1/2005  Alawani et al. ............ 174/260

FOREIGN PATENT DOCUMENTS

JP     2004-103998 A     4/2004

* cited by examiner

*Primary Examiner*—Ishwar (I. B.) Patel
(74) *Attorney, Agent, or Firm*—McDermott Will & Emery LLP

(57) ABSTRACT

A circuit component mounting device includes a resin substrate, vias, a circuit component composed of a main body and electrode portions, a solder, and an insulative sealing resin that covers the circuit component and the solder. The device further includes a base metal pattern which covers parts of the principal face of the resin substrate where the vias are exposed and is composed of a Cu layer and a Ni layer and a copper plated pattern which is provided on the base metal pattern and is composed of a Cu layer, a Ni layer, and an Au layer. The circuit component is provided on the copper plated pattern. The solder allows the copper plated pattern and the circuit component to adhere to each other.

4 Claims, 6 Drawing Sheets

CIRCUIT COMPONENT MOUNTING DEVICE

BACKGROUND ART

The present invention relates to a circuit component mounting device in which a circuit component is mounted on a substrate, and particularly relates to a structure of a circuit component mounting device in which conductor members provided on a substrate adhere to a circuit component by means of a solder.

Recently, circuit component mounting devices are being developed in which a highly-integrated circuit component is mounted and the mainstream structure thereof employs a circuit component covered with an insulative sealing resin in view of cost merits such as efficient production and the like. The circuit component is mounted on a set substrate after being packaged using a solder as an adhesive. This solder is dissolved in reflow for mounting to involve solder bridging that brings a short circuit between electrodes of the circuit component. This phenomenon is such that a several-micron gap remaining between the circuit component and the surface of the substrate is too small to be filled with the sealing resin sufficiently and the solder dissolved in mounting of a circuit component mounting device to the set substrate runs through the gap by pressure by its volume expansion, causing a short circuit between the electrodes. FIG. 7A is a section showing a structure of a conventional circuit component mounting device. As shown in FIG. 7A, the conventional circuit component mounting device includes: a resin substrate 101; vias 106 of which via holes passing through the resin substrate 101 are filled with a conductive resin; electrodes 105 that cover parts of the principal face of the resin substrate 101 where the vias 106 are exposed; a circuit component 103 provided on the electrodes 105 and composed of a main body 103a and electrode portions 103b; a solder 104 for allowing the electrodes 105 and the circuit component 103 to adhere to each other; an insulative sealing resin 102 that covers the circuit component 103 and the solder 104; and electrodes 111 that cover parts of the reverse face of the resin substrate 101 where the vias 106 are expose.

FIG. 7B is a section showing in detail a structure of the electrodes 105 of the conventional circuit component mounting device. As shown in FIG. 7B, each conventional electrode 105 is composed of: a Cu layer 121 covering the top of the via 106 (shown in FIG. 7A) and having a thickness of 10 to 40 µm; a Ni layer 122 provided on the Cu layer 121 and having a thickness of 6 µm; and an Au layer 123 provided on the Ni layer 122 and having a thickness of 0.5 µm.

In the above structure, the two electrode portions 103b provided on the sides of the main body 103a of the circuit component 103 are mounted on the two electrodes 105 provided on the principal face of the resin substrate 101. A space 107 is created in a region below the main body 103a of the circuit component 103, that is, a region between the two electrodes 105. The solder 104, which allows the electrode portions 103b and the electrodes 105 to adhere to each other, is liable to enter into the space 107.

Referring to countermeasures to prevent the solder bridging, there is a method in which the flow of the solder is inhibited by enlarging the space 107 between the circuit component 103 and the resin substrate 101 and filling the insulative sealing resin 102 therein. As one kind of this method, there has been proposed a method in which a solder resist (not shown) having height to some extent is provided on each side of the space 107 so as to support the circuit component 103 and the sealing resin is allowed to flow into the space 107 increased in height (see Japanese Patent Application Laid Open Publication No. 2004-103998A).

In association with size reduction of the circuit component mounting devices, the circuit components reduce its size, also. For example, in a circuit component 103 in 0.6 mm×0.3 mm size, the distance between the electrodes is about 0.25 mm. In general, according to the design rule for the solder resist, the minimum width and the maximum adjacent distance are about 0.1 mm, and therefore, it is difficult to provide a solder resist having sufficient thickness on each side of the space 107 in the case where the width of the space 107 between the electrodes 105 is 0.25 mm. Under the circumstances, it is necessary to form the space 107 in sufficiently large size even in a case using such a small-sized circuit component 103.

Further, in association with the size reduction of the circuit component mounting devices, the circuit components 103 to be mounted on the devices are highly integrated. This invites electromagnetic field interference between the circuit component 103 and a circuit pattern (not shown) both of which are provided on the resin substrate 101, degrading electric characteristics of the devices. For preventing this incident, a wall serving as a shield may be provided between the circuit component 103 and the circuit pattern. However, this inhibits higher integration.

SUMMARY OF THE INVENTION

The present invention has its object of providing a circuit component mounting device capable of preventing solder bridging and preventing electromagnetic field interference between a circuit component and a circuit pattern.

The first aspect of the present invention provides a circuit component mounting device including: a substrate; two conductor members provide on parts of the substrate; a circuit component which is provided on the two conductor members and includes two electrodes in contact with the conductor members and a main body interposed between the two conductor members; a solder which allows the conductor members and the circuit component to adhere to each other; and an insulator which includes grains and is filled in a region interposed between the two conductor members in a region between the substrate and the circuit component, wherein height of the conductor members is three times or more than an average grain diameter of the grains of the insulator.

With the above structure, the region interposed between the two conductor members in the region between the substrate and the circuit component becomes easy to be filled with the insulator. This prevents the solder re-dissolved in reflow after the circuit component is mounted on the substrate from flowing into the space, whereby solder bridging that brings a short circuit between the conductor members can be prevented. Further, the increase in height of the circuit component suppresses variation in electric characteristics of the circuit component which is due to influence from the ground.

In the circuit component mounting device of the first aspect of the present invention, the height of the conductor members is preferably 30 µm or larger.

In the circuit component mounting device of the first aspect of the present invention, the conductor members may be formed by two-time or more plating.

In the circuit component mounting device of the first aspect of the present invention, the conductor members may include balls formed by wire bonding. When the balls formed by wire bonding are used as the conductor members, the distance between the two conductor members can be shortened up to about 50 μm. Accordingly, the present invention becomes applicable to devices of which circuit component to be mounted is small, for example, in 0.4 mm×0.2 mm size. Especially, when a ceramic substrate, which necessitates firing, is used as the substrate, it is difficult to form a thick plate on the substrate. Hence, this method employing wire bonding becomes much effective.

In the circuit component mounting device of the first aspect of the present invention, a circuit pattern made of a conductive material may be formed on another part of the substrate. In this case, the distance between the circuit component and the circuit pattern becomes longer than that of the conventional one, reducing the electromagnetic field interference therebetween. In other words, this structure gains a vertical distance between the circuit component and the circuit pattern, so that a horizontal distance therebetween can be reduced compared with the conventional one. Hence, element compaction can be attained.

The second aspect of the present invention provides a circuit component mounting device including: a substrate; two conductor members provided on parts of the substrate; a circuit component which is provided on the two conductor members and includes two electrodes in contact with the conductor members and a main body interposed between the two conductor members; a solder which allows the conductor members and the circuit component to adhere to each other; and a circuit pattern which is made of a conductive material and is provided on another part of the substrate, wherein un upper level of the conductor members is higher than height of the circuit pattern.

In general, the conductor members and the circuit pattern, which are formed by the same process of plating, have the same film thickness. In contrast, in the circuit component mounting device of the second aspect of the present invention, the conductor members are formed by performing plating twice or more times or by wire bonding for increasing the height of the conductor members. Hence, the conductor members become higher than the circuit pattern.

With this structure, the region interposed between the two conductor members in the region between the substrate and the circuit component becomes easy to be filled with the insulator. This prevents the solder re-dissolved in reflow after the circuit component is mounted on the substrate from flowing into the space. Whereby, the solder bridging that brings a short circuit between the conductor members can be prevented. Further, with the circuit component increased in height, variation in electric characteristics, which is due to influence from the ground, can be reduced.

Moreover, the distance between the circuit component and the circuit pattern becomes longer than that of the conventional one, reducing the electromagnetic field interference therebetween. In other words, this structure gains a vertical distance between the circuit component and the circuit pattern, so that a horizontal distance therebetween can be reduced compared with the conventional one. Hence, element compaction can be attained.

The circuit component mounting device of the second aspect of the present invention may further include a resin filled in a region interpose between the two conductor members in a region between the substrate and the circuit component.

In the circuit component mounting device of the second aspect of the present invention, the height of the conductor members is preferably 30 μm or larger.

DESCRIPTION OF THE PREFERRED EMBODIMENTS

Embodiments of the present invention will be described below with reference to the accompanying drawings.

Embodiment 1

Figure 1A:
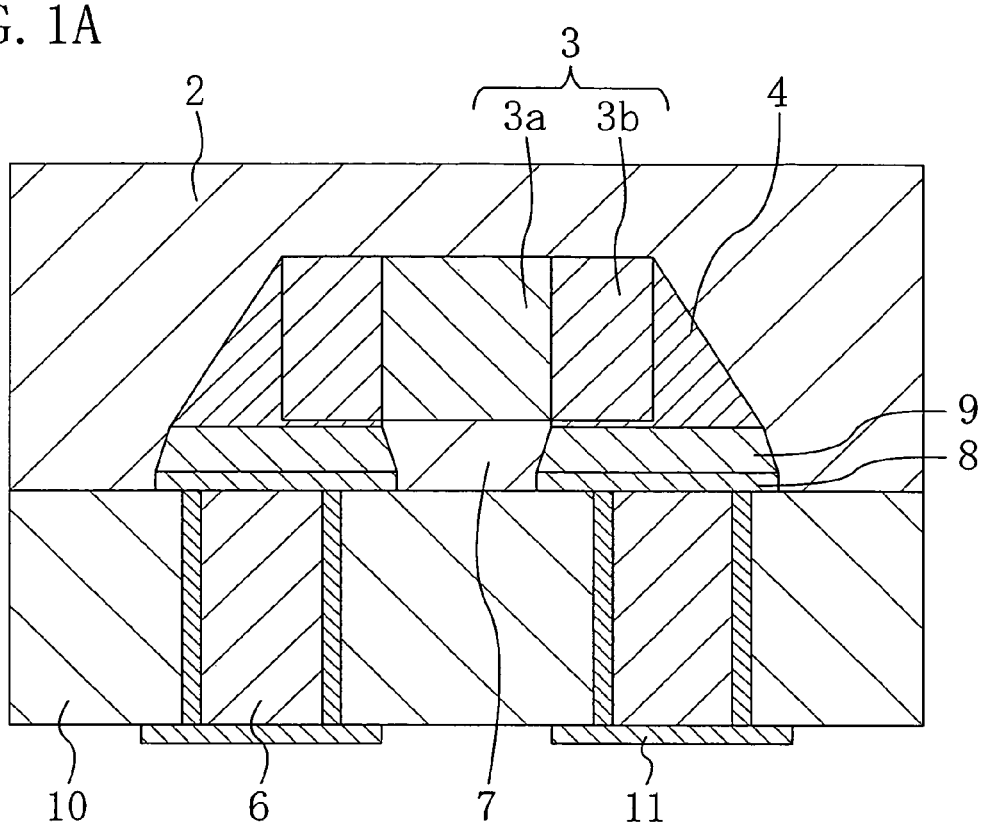
FIG. 1A is a section showing a structure of a circuit component mounting device of Embodiment 1.

FIG. 1A is a section showing a structure of a circuit component mounting device of Embodiment 1. As shown in FIG. 1A, the circuit component mounting device of the present embodiment includes: a resin substrate (or a multi-layered resin substrate) 10; vias 6 of which via holes passing through the resin substrate 10 are filled with a conductive resin; a base metal pattern 8 that covers a part of the principal face of the resin substrate 10 where the vias 6 are exposed; a copper plated pattern 9 provided on the base metal pattern 8; a circuit component 3 provided on the copper plated pattern 9 and composed of a main body 3a and electrode portions 3b; a solder 4 for allowing the copper plated pattern 9 and the circuit component 3 to adhere to each other; an insulative sealing resin 2 that covers the circuit component 3 and the solder 4; and electrodes 11 that cover parts of the reverse face of the resin substrate 10 where the via holes are expose. The circuit component 3 is in 0.6 mm×0.3 mm size, for example. In this case, a region 7 between metals of the base metal pattern 8 has a width of about 0.25 mm. Wherein, a resin of which filler has an average grain diameter of 20 μm and a maximum grain diameter of 60 μm is used as the insulative sealing resin 2.

Figure 1B:
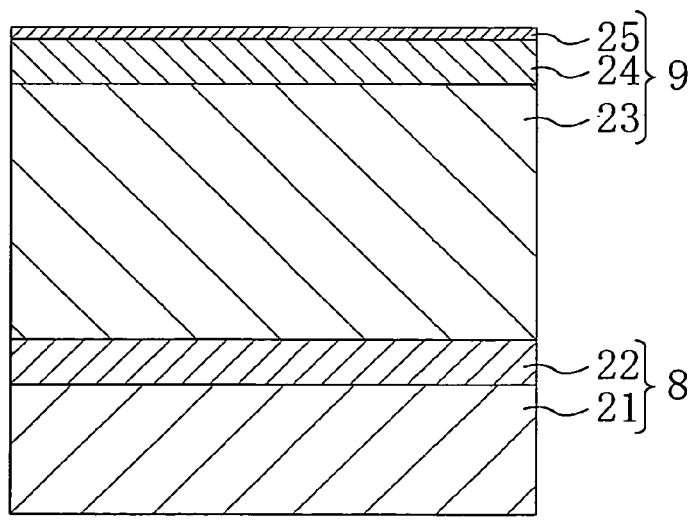
FIG. 1B is a sections showing in detail a structure of a base metal pattern 8 and a copper plated pattern 9.

FIG. 1B is a section showing in detail a structure of the base metal pattern 8 and the copper plated pattern 9. As shown in FIG. 1B, the base metal pattern 8 is composed of a Cu layer 21 covering the vias 6 (shown in FIG. 1A) and having a thickness of 8 to 40 μm and a Ni layer 22 provided on the Cu layer 21 and having a thickness of 6 μm. The copper plated pattern 9 is composed of a Cu layer 23 provided on the Ni layer 22 of the base metal pattern 8 and having a thickness of 40 μm, a Ni layer 24 provided on the Cu layer 23 and having a thickness of 6 µm, and an Au layer 25 provided on the Ni layer 24 and having a thickness of 0.5 µm.

The structure shown in FIG. 1B is formed by the following method. First, electroless Cu plating is performed to form the Cu layer 21 on the vias 6 (shown in FIG. 1A) and electro Ni plating is performed to form the Ni layer 22 on the Cu layer 21. Subsequently, electroless Cu plating is performed again, and then, an unnecessary part is removed by etching, thereby forming the Cu layer 23. In this etching, the Ni layer 22 serves to prevent the Cu layer 21 located thereunder from being etched. Next, the Ni layer 24 is formed on the Cu layer 23 and the Au layer 25 is formed on the Ni layer 24. The Ni layer 24 serves to prevent Au in the Au layer 25 from diffusing into the Cu layer 23.

Figure 2A:
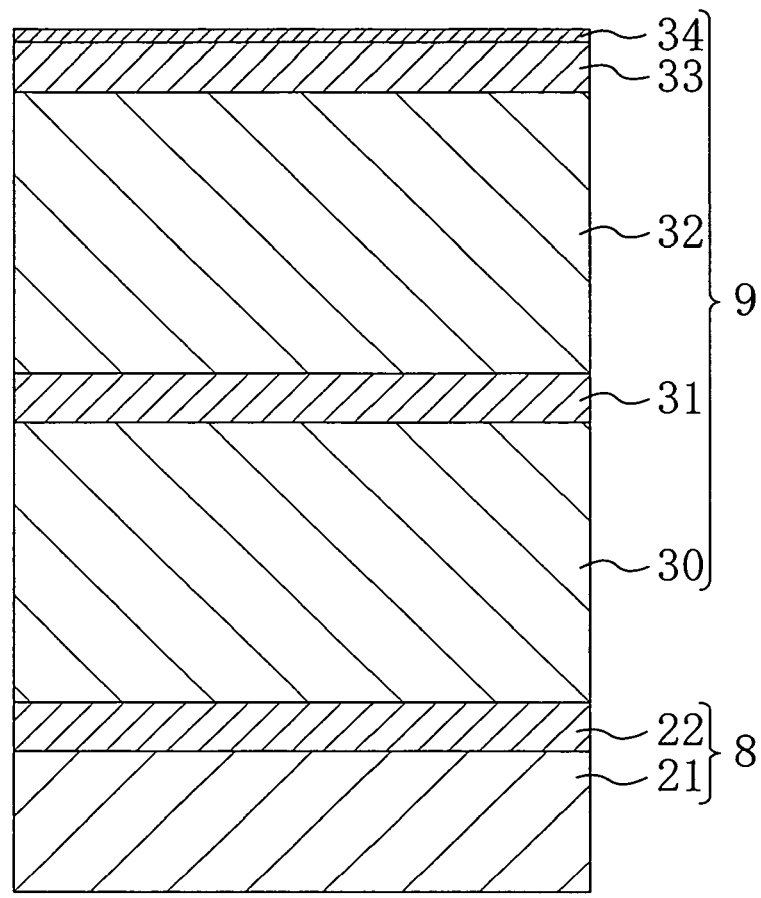
FIG. 2A is a section showing a structure in the case where a copper plated pattern is formed by two-time or more Cu plating.
Figure 6:
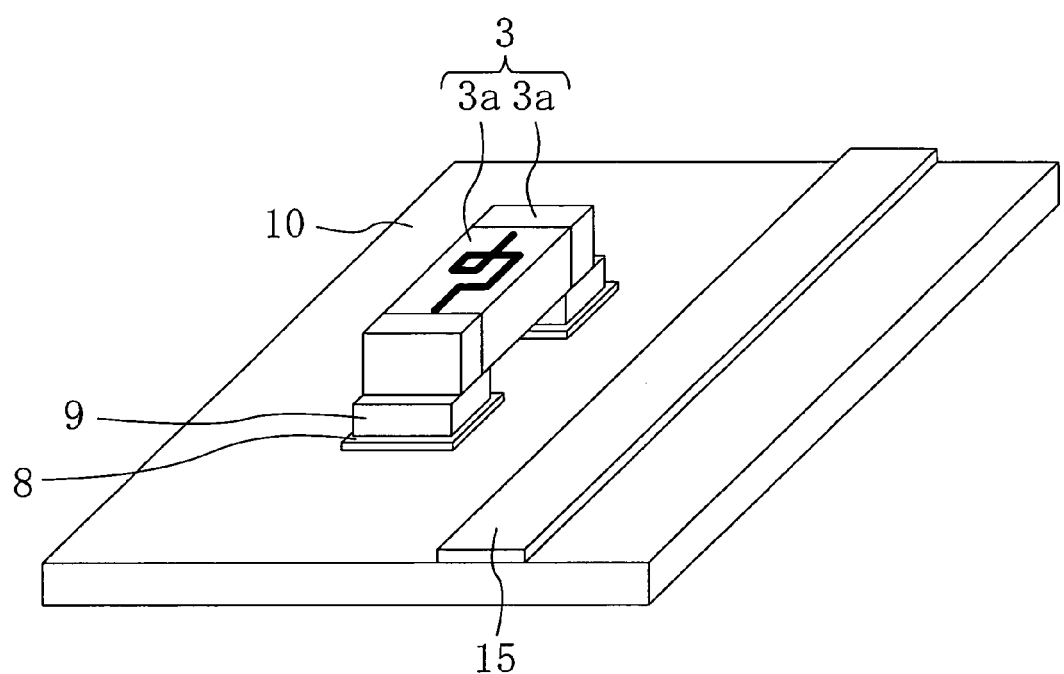
FIG. 6 is a perspective view showing a construction of a circuit component mounting device of Embodiment 4.
Figure 7A:
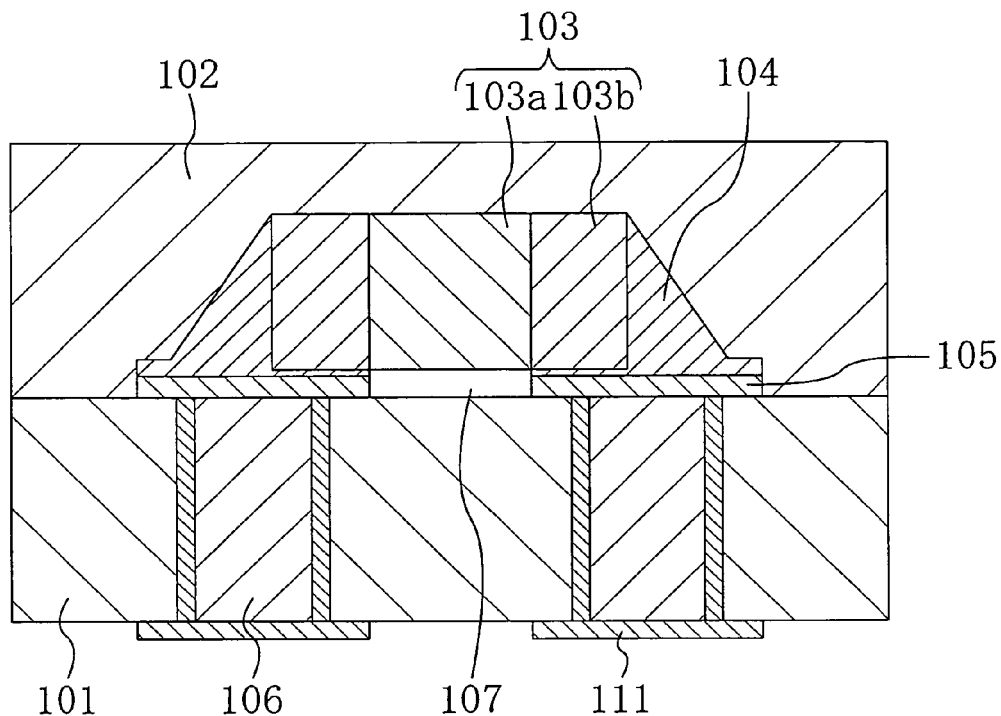
FIG. 7A is a section showing a structure of a conventional circuit component mounting device.
Figure 7B:
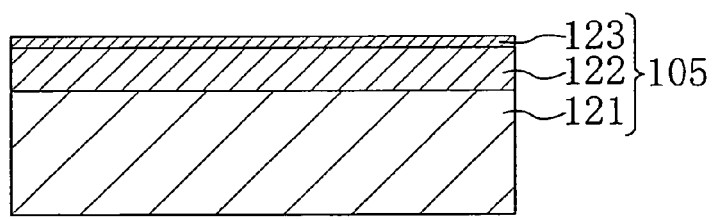
FIG. 7B is a section showing in detail a structure of an electrode in the conventional circuit component mounting device.

It is noted that any conductive materials may be used as materials of the base metal pattern 8 and the copper plated pattern 9 as long as no hindrance to mounting of the circuit component 3 is involved. Further, in the above description, the Cu layer 21 is composed of one layer of a Cu plated layer in the base metal pattern 8 and the Cu layer 23 is composed of one layer of a Cu plated layer in the copper plated pattern 9, as one example. However, as shown in FIG. 2A, Cu plating may be performed twice or more times to form the copper plated pattern 9. In the case shown in FIG. 2A, the copper plated pattern 9 has a layered structure of a first Cu layer 30 having a thickness of 10 to 40 µm, a first Ni layer 31 having a thickness of 6 µm, a second Cu layer 32 having a thickness of 10 to 40 µm, a second Ni layer 33 having a thickness of 6 µm, and an Au layer 34 having a thickness of 0.5 µm, which are layered in this order. In the structure in which the copper plated pattern 9 is formed by three-time or more Cu plating, though not shown, Cu layers and Ni layers are layered alternately and an Au layer is provided as an uppermost layer thereof. The increase in Cu plated layers in the copper plated pattern 9 increases the film thickness of the copper plated pattern 9. In the case where the circuit component 3 to be mounted has low frequency (frequency lower than about 800 MHz), DC loss of a circuit pattern 15 formed simultaneously with the base metal pattern 8 as shown in FIG. 6 can be reduced by increasing the distance between the resin substrate 10 and the circuit component 3. Thus, the present invention is much useful when the copper plated pattern 9 is formed thick in a circuit component mounting device having low frequency.

Figure 2B:
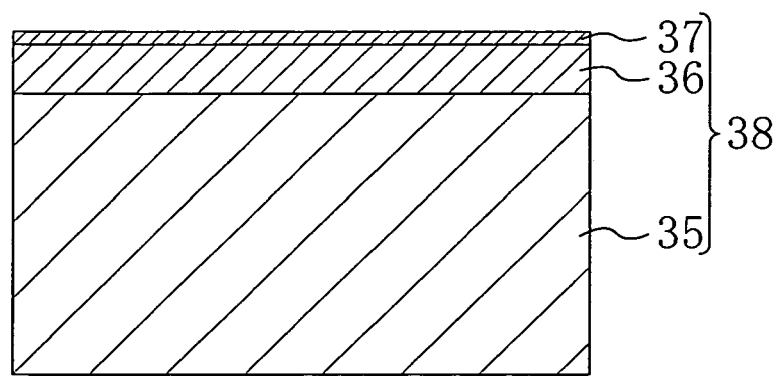
FIG. 2B is a section showing a structure in the case where a plated pattern is formed by one-time Cu plating.

Further, as shown in FIG. 2B, only a plated pattern 38 of one layer may be formed rather than the base metal pattern 8 and the copper plated pattern 9. In this case, the plated pattern 38 has a structure in which a Cu layer 35 having a thickness of 20 µm, a Ni layer 36 having a thickness of 6 µm, and an Au layer 37 having a thickness of 0.5 µm are layered in this order, for example. The formation of the plated pattern 38 by one-time plating minimizes variation in film thickness. The minimized variation in film thickness attains suppression of variation in impedance of the circuit pattern 15 formed simultaneously with the base metal pattern 8 as shown in FIG. 6. Therefore, the present invention is much useful for a circuit component mounting device having high frequency (frequency higher than about 800 MHz) which requires precise impedance.

In the circuit component mounting device of the present embodiment, a metal bump composed of the base metal pattern 8 and the copper plated pattern 9 is provided, so that the height of the region 7 between the circuit component 3 and the resin substrate 10 increases to about 120 µm to the maximum. In the above description, the insulative sealing resin 2 of which filler has an average grain diameter of 20 µm and a maximum grain diameter of 60 µm is used, and accordingly, the height of the region 7 is about six times the average grain diameter of the filler. When the height of the region 7 is three times or more than the average grain diameter of the filler, namely, when the region 7 has height larger than the maximum grain diameter, the insulative sealing resin 2 can be filled in the region 7 sufficiently. When the region 7 is filled up sufficiently in this way, the solder re-dissolved and expanded in the reflow performed after the circuit component mounting device of the present embodiment is mounted on the set substrate is prevented from flowing out into the region 7, preventing solder bridging that brings a short circuit in the base metal pattern 8. It is noted that the filler has an average grain diameter of 10 µm or larger in a general insulative sealing resin 2 used in molding, and therefore, the height of the region 7 is preferably three time or more than the average grain diameter, that is, 30 µm or larger.

Further, in the present embodiment, with the circuit component 3 increased in height, variation in electric characteristics of the circuit component 3, which is due to influence from the ground, is suppressed.

The present embodiment attains the effects when the total film thickness of the base metal pattern 8 and the copper plated pattern 9 is 30 µm or larger. This value is established from the fact that the region 7 is sufficiently high when it has the height equal to or larger than the maximum grain diameter, that is, three times or more than the average grain diameter.

Embodiment 2

Figure 3:
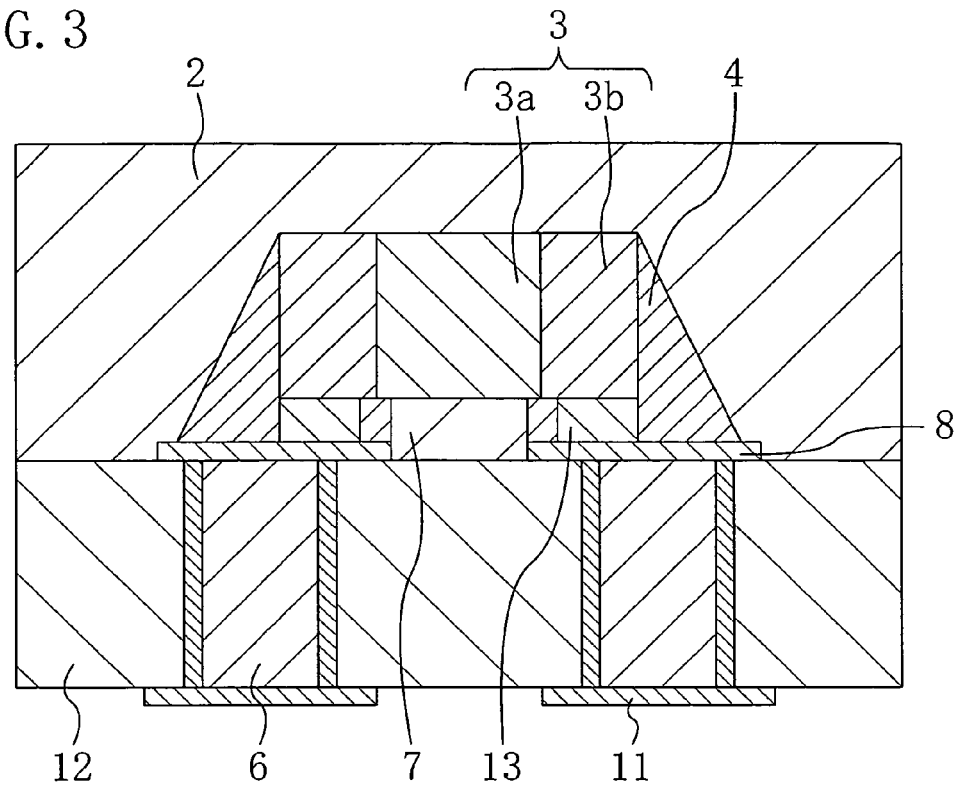
FIG. 3 is a section showing a structure of a circuit component mounting device of Embodiment 2.

FIG. 3 is a section showing a structure of a circuit component mounting device of Embodiment 2. As shown in FIG. 3, in the present embodiment, a ceramic substrate (or a multilayered ceramic substrate) 12 is used rather than the resin substrate 10 (shown in FIG. 1) used in Embodiment 1. On the ceramic substrate 12, there are provided a base metal pattern 8 formed by firing and having a thickness of about 15 µm and Au balls 13 formed on the base metal pattern 8 by wire bonding. The firing is performed at a temperature between about 800 and 1500° C. after applying a paste-state Cu film (now shown) and a paste-state Ni film (not shown). A circuit component 3 composed of a main body 3a and electrode portions 3b are arranged on the Au balls 13. The other constitution is the same as that of Embodiment 1, and the description thereof is omitted.

The Au balls 13 are formed by two-time wire bonding after the substrate in which the base metal pattern 8 has been formed is introduced in a wire bonding system (not shown). For example, when wire bonding is performed using an Au wire having a diameter of 25 µm, the Au balls 13 have a height of about 50 to 75 µm. It is noted that a wire connected to the Au balls 13 is removed in FIG. 3, but may not be necessarily removed. The circuit component 3 is mounted in such a manner that a solder paste is applied on the base metal pattern 8 and the Au balls 13, the circuit component 3 is mounted onto the solder paste, and then, reflow is performed.

In the present embodiment, the provision of the base metal pattern 8 having a thickness of about 15 µm and the Au balls 13 having a height of 50 to 70 µm creates a space having a height of about 65 to 85 µm between the circuit component 3 and the ceramic substrate 12. In general, the filler of the insulative sealing resin 2 used in molding has an average grain diameter of 20 µm and a maximum grain diameter of 60 µm. This means that the region 7 has height three to four times the average grain diameter of the filler. When the height of the region 7 is three times or more than the average grain diameter of the filler, namely, when the region 7 has height larger than the maximum grain diameter, the insulative sealing resin 2 can be filled in the region 7 sufficiently. When the region 7 is filled up sufficiently in this way, the solder re-dissolved and expanded in the reflow performed after the circuit component mounting device of the present embodiment is mounted on the set substrate is prevented from flowing out to the region 7, preventing solder bridging that brings a short circuit in the base metal pattern 8. It is noted that there are variation in the average grain diameter and the maximum grain diameter, and accordingly, the present embodiment can attain the effects when the total film thickness of the base metal pattern 8 and the Au balls 13 is within the range between 60 μm and 140 μm, both inclusive.

Further, in the case where the Au balls 13 are formed by wire bonding, a distance between the two Au balls 13 can be reduced up to about 50 μm. Accordingly, the present embodiment is effective especially when the circuit component 3 is a small in size, for example, in 0.4 mm×0.2 mm size. In addition, when the ceramic substrate 12 is used as the substrate, which necessitates firing, it is difficult to form a thick plate on the ceramic substrate 12. In such a case, hence, the method employing wire bonding is effective especially.

It is noted that when multiple Au balls 13 are provided, the circuit component 13 can be mounted further stably.

Embodiment 3

Figure 4:
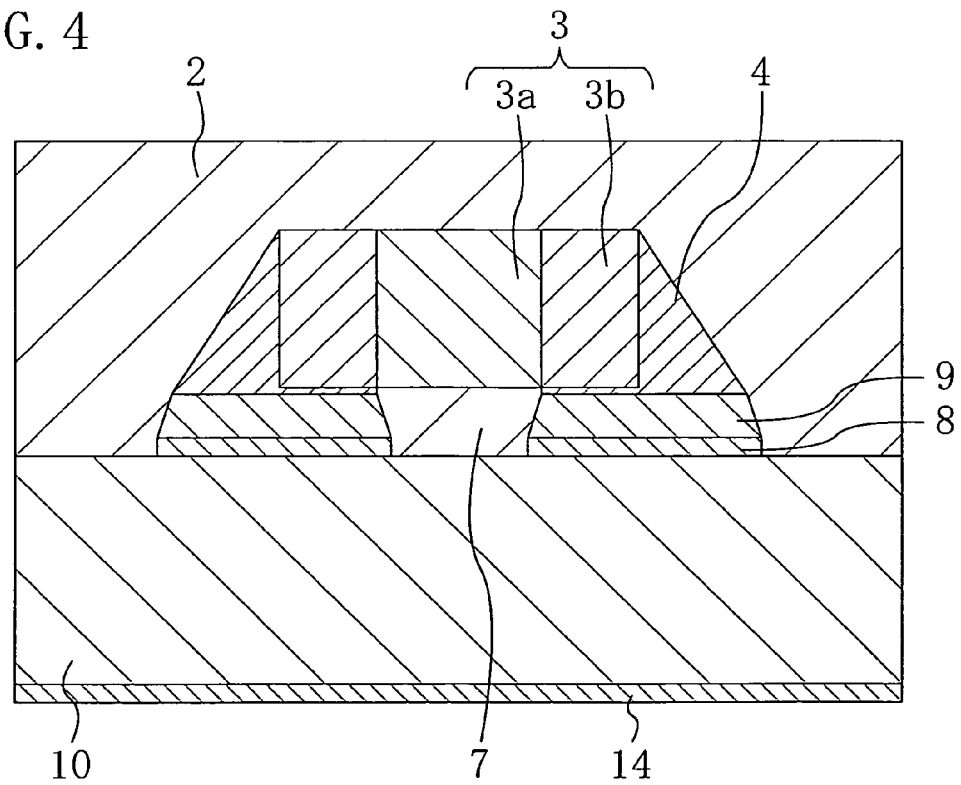
FIG. 4 is a section showing a structure of a circuit component mounting device of Embodiment 3.

FIG. 4 is a section showing a structure of a circuit component mounting device of Embodiment 3. As shown in FIG. 4, difference in the present embodiment from Embodiment 1 lies in that a GND pattern 14 is formed on the reverse face of the resin substrate 10. The other constitution is the same as that in Embodiment 1, and the description thereof is omitted.

In the structure in the present embodiment, the circuit component 3 is formed high from the upper level of the resin substrate 10, so that the circuit component 3 receives less influence of variations in conductivity and film thickness of the resin substrate 10. Whereby, the electric characteristics of the circuit component 3 vary less.

Figure 5:
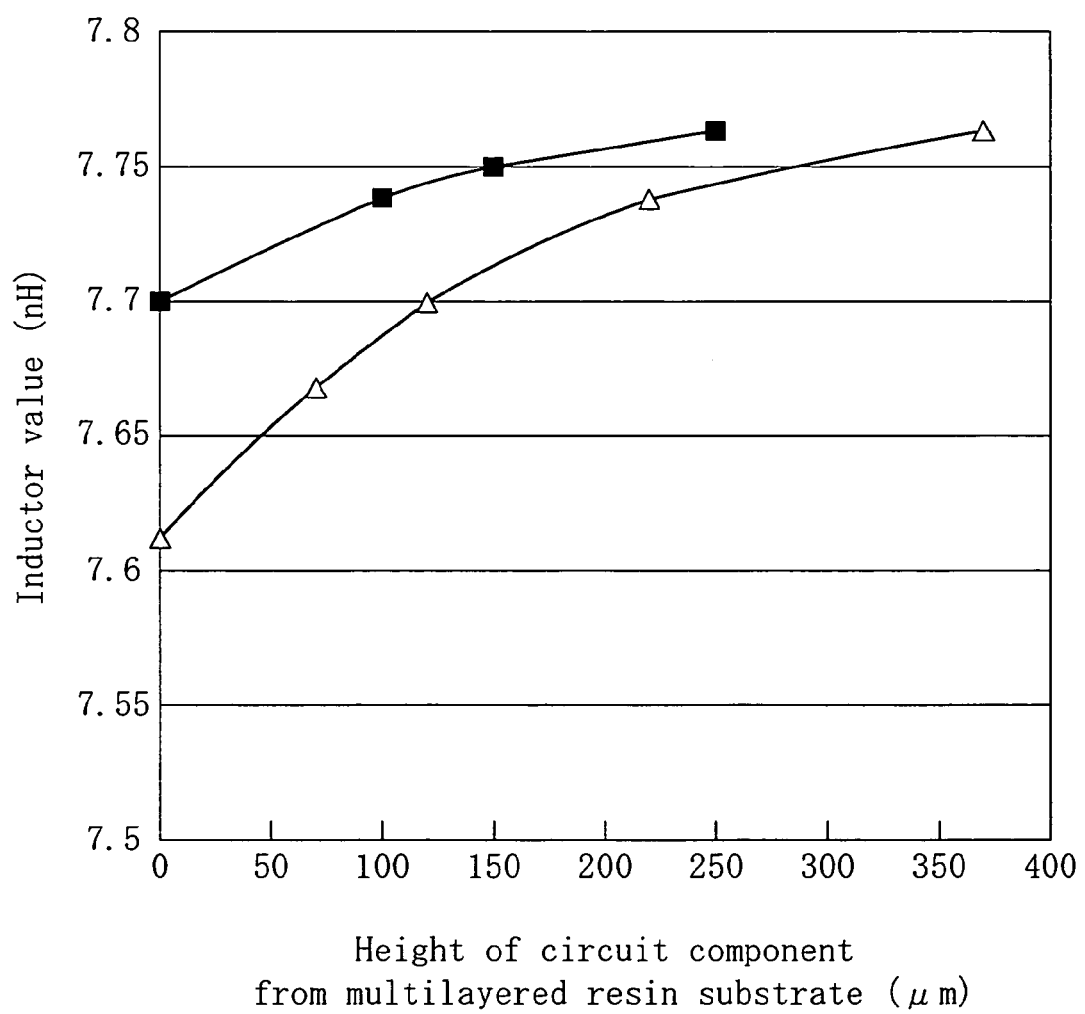
FIG. 5 is a graph showing the state in which inductor values of thin film coils vary with distance between a circuit component 3 and a resin substrate 10 in the case where the circuit component 3 is the thin film coil.

FIG. 5 is a graph showing the state in which inductor values of thin film coils vary with distance between the circuit component 3 and the resin substrate 10. In the graph of FIG. 5, the axis of abscissas indicates the height of the circuit component 3 from the resin substrate 10 while the axis of ordinates indicates the inductor value of a thin film coil provided in the circuit component 3. Also, in the graph, the profile indicated by the line connecting the triangular points expresses the result obtained by measuring a thin film coil having a size of 0.6×0.3 mm and the profile indicated by the line connecting the square points expresses the result obtained by measuring a thin film coil having a size of 1.0×0.5 mm. Though not shown, a coil pattern of the thin film coil is provided on the upper face of the circuit component 3 and the circuit pattern 3 has a thickness of about 0.2 mm to 0.35 mm. The inductor values are measured when the frequency is 1 GHz.

As shown in FIG. 5, variations in inductor value become gentle in both the thin film coils as the height of the circuit component 3 from the resin circuit 10 increases and each variation becomes sufficiently gentle when the height is 100 μm or larger. The two layers of Cu layers (the Cu layers 21, 24) are provided in Embodiment 1 and the present embodiment, but three or more layers can attain more gentle variation in inductor value.

Further, even in the case where a component other than the thin film coil is formed in the circuit component 3, the electric characteristics of the circuit component 3 less vary also, compared with the conventional one. This facilitates calculation of a correlation between simulation results and actual measured values, resulting in more accurate estimation of the actual measured values from the simulation results.

It is noted that the base metal pattern 8 and the copper plated pattern 9 are provided in the present embodiment and Embodiment 1, but the same effects can be obtained in the structure in which the base metal pattern 8 and the Au balls 13 are provided as in Embodiment 2.

Embodiment 4

FIG. 6 is a perspective view showing a structure of a circuit component mounting device in Embodiment 4. As shown in FIG. 6, a circuit pattern 15 such as a signal wiring is formed beside a circuit component 3 on a resin substrate 10 in the present embodiment. This circuit pattern 15 is formed simultaneously with the formation of a base metal pattern 8 on which the circuit component 3 is to be mounted. Specifically, patterning is performed simultaneously with plating of the Cu layer and the Ni layer on the resin substrate 10 so that the base metal pattern 8 and the circuit pattern 15 are formed simultaneously. The circuit component 3 is mounted on the copper plated pattern 9 on the base metal pattern 8, so that the upper level of the circuit component 3 becomes higher than the height of the circuit pattern 15. The method for mounting the circuit component 3 is the same as that described in Embodiment 1, and the description thereof is omitted.

In a general conventional method, the conductor members on which the circuit component is to be mounted and the circuit pattern are formed in the same plating process, so that the conductor members and the circuit pattern has the same film thickness. In the present embodiment, however, the copper plated pattern 9 is formed on the base metal pattern 8 for raising the upper level of the circuit component 3. Therefore, the upper level of the circuit component 3 after being mounted becomes higher than the height of the circuit pattern 15.

In the present embodiment, the upper level of the circuit component 3 is raised by the base metal pattern 8 and the copper plated pattern 9. This increases the distance between the circuit component 3 and the circuit pattern 15, reducing electromagnetic filed interference between the circuit component 3 and the circuit pattern 15. In other words, this structure gains a vertical distance between the circuit component 3 and the circuit pattern 15, so that a horizontal distance therebetween can be reduced compared with the conventional one. Thus, element compaction can be attained.

It is noted that the effects described in Embodiment 1 can be obtained also by the structure in the present embodiment.

What is claimed is:

1. A circuit component mounting device, comprising:
a substrate;
two conductor members provide on parts of the substrate;
a circuit component which is provided on the two conductor members and includes two electrodes in contact with the conductor members and a main body interposed between the two conductor members;
a solder which allows the conductor members and the circuit component to adhere to each other; and
an insulator which includes grains and is filled in a region interposed between the two conductor members in a region between the substrate and the circuit component,
wherein the conductor members are comprised of a base metal pattern which is made of a Cu layer and a Ni layer and a plated pattern which is made of a Cu layer, a Ni layer and a Au layer and formed on the base metal pattern, the base metal pattern is formed at the same time when a circuit pattern is formed on another part of the substrate, and height of the conductor members is three times or more than an average grain diameter of the grains of the insulator.

2. The circuit component mounting device of claim 1, wherein the height of the conductor members is 30 μm or larger.

3. The circuit component mounting device of claim 1, wherein the conductor members are formed by two-time or more plating.

4. The circuit component mounting device of claim 1, wherein a circuit pattern made of a conductive material is formed on another part of the substrate.

* * * * *